(12) United States Patent  (10) Patent No.: US 7,914,950 B2
Hung et al.  (45) Date of Patent: Mar. 29, 2011

(54) METHOD AND RESULTING STRUCTURE FOR MOSAIC OF MULTI-TRANSMISSION RATE OPTICAL MASK STRUCTURES

(75) Inventors: Chi Yuan Hung, Yi-Lan (TW); Bin Zhang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 974 days.

(21) Appl. No.: 11/190,390

(22) Filed: Jul. 26, 2005

(65) Prior Publication Data

US 2006/0099520 A1 May 11, 2006

(30) Foreign Application Priority Data

Nov. 8, 2004 (CN) .......................... 2004 1 0068071

(51) Int. Cl.
G03F 1/00 (2006.01)
(52) U.S. Cl. ............................................ 430/5

(58) Field of Classification Search ...................... 430/5
See application file for complete search history.

(56) References Cited

U.S. PATENT DOCUMENTS

| 6,994,939 B1 * | 2/2006 | Ghandehari et al. ............. 430/5 |
| 2002/0132173 A1 * | 9/2002 | Rolfson ............................. 430/5 |
| 2004/0197677 A1 * | 10/2004 | Kohle et al. ........................ 430/5 |
| 2005/0208390 A1 * | 9/2005 | Xiao ................................. 430/5 |

* cited by examiner

*Primary Examiner* — Stephen Rosasco
*Assistant Examiner* — Jonathan Jelsma
(74) *Attorney, Agent, or Firm* — Kilpatrick Townsend and Stockton LLP

(57) ABSTRACT

A reticle device. The device has a quartz substrate, which has a surface region. A first region comprising a plurality of binary mask patterns is formed on a first portion of the surface region. A second region comprising a plurality of first phase shift mask patterns is formed on a second portion of the surface region. A third region comprising a plurality of second phase shift mask patterns is formed on a third portion of the surface region. Accordingly, the reticle device has at least three different regions corresponding to different optical characteristics.

18 Claims, 7 Drawing Sheets

Transmission and phase-shifting mask with the corresponding electric fields and irradiances.

$$\theta = \frac{2\pi a(n_2-1)}{\lambda}$$

When $\theta = \pi$ $$\therefore a = \frac{\lambda}{2(n_2-1)}$$

a : Thickness of shifter layer $n_2$ : Refractive index $\lambda$ : Wavelength

Rayleigh Equations

$$R = \frac{K_1 \times \lambda}{NA}$$

$$DOF = \frac{K_2 \times \lambda}{(NA)^2}$$

R : Resolution
$\lambda$ : Exposure Wavelength
NA : Numerical Aperture of Lens
DOF : Depth of Focus
$K_1$ : Process Coefficient
$K_2$ : Function of $K_1$ Ex : Resolution at $\lambda = 248$nm $$R = \frac{0.6 \cdot 0.248}{0.6} = 0.248 \text{ um}$$

Figure 5

| Line/Space | 0.16/0.2 | 0.16/0.24 | 0.16/0.3 | 0.16/0.46 | 0.16/0.8 | 0.16/1.6 |
|---|---|---|---|---|---|---|
| Binary | 0.45 | 0.65 | 0.7 | 0.73 | 0.72 | 0.5 |
| 6%ATT | 0.57 | 0.75 | 0.9 | 0.65 | 0.82 | 0.6 |
| 32%ATT | 0.8 | 0.9 | 0.85 | 0.6 | 0.75 | 0.71 | we apply multi-transmission att. Mask. The strategy as show in Table 2.

| Line/Space | 0.16/0.2 | 0.16/0.24 | 0.16/0.3 | 0.16/0.46 | 0.16/0.8 | 0.16/1.6 |
|---|---|---|---|---|---|---|
| Transmission | 32%ATT | 32%ATT | 6%ATT | Binary | 6%ATT | 32%ATT |

Figure 6

Table 1. DOF@6%EL for 0.16um features with0.6NA and 0.8 Sigma (Simulation result)

| Line/Space | 0.16/0.2 | 0.16/0.24 | 0.16/0.3 | 0.16/0.46 | 0.16/0.8 | 0.16/1.6 |
|---|---|---|---|---|---|---|
|  |  |  |  |  |  |  |
| 6%ATT | 0.57 | 0.75 | 0.9 | 0.65 | 0.82 | 0.6 |
|  |  |  |  |  |  |  |

Figure 7

METHOD AND RESULTING STRUCTURE FOR MOSAIC OF MULTI-TRANSMISSION RATE OPTICAL MASK STRUCTURES

BACKGROUND OF THE INVENTION

The present invention is directed to integrated circuits and their processing for the manufacture of semiconductor devices. More particularly, the invention provides a method and structures for a multi-transmission rate optical mask structure for manufacture of semiconductor devices. Merely by way of example, the invention has been applied to the manufacture of advanced integrated circuit devices, but it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is the ability to procure mask sets used for the manufacture of integrated circuits in a cost effective and efficient way.

Fabrication of custom integrated circuits using chip foundry services has evolved over the years. Fabless chip companies often design the custom integrated circuits. Such custom integrated circuits require a set of custom masks commonly called "reticles" to be manufactured. A chip foundry company called Semiconductor International Manufacturing Company (SMIC) of Shanghai, China is an example of a chip company that performs foundry services. Although fabless chip companies and foundry services have increased through the years, many limitations still exist. For example, mask sets used for the manufacture of the custom integrated circuits are often expensive. That is, they can cost hundreds of thousands of U.S. dollars and take along lead-time to make. Additionally, there are a limited amount of mask shops that manufacture masks, also leading to difficulty in procuring the mask sets for the custom integrated circuits. These and other limitations are described throughout the present specification and more particularly below.

From the above, it is seen that an improved technique for processing semiconductor devices is desired.

BRIEF SUMMARY OF THE INVENTION

According to the present invention, techniques directed to integrated circuits and their processing for the manufacture of semiconductor devices are provided. More particularly, the invention provides a method and structures for a multi-transmission rate optical mask structure for manufacture of semiconductor devices. Merely by way of example, the invention has been applied to the manufacture of advanced integrated circuit devices, but it would be recognized that the invention has a much broader range of applicability.

In a specific embodiment, the present invention provides a reticle device. The device has a quartz substrate, which has a surface region. A first region comprising a plurality of opaque mask patterns also called binary mask patterns is formed on a first portion of the surface region. A second region comprising a plurality of first attenuated phase shift mask patterns is formed on a second portion of the surface region. A third region comprising a plurality of second attenuated phase shift mask patterns is formed on a third portion of the surface region and so on. Accordingly, the reticle device has at least three different regions corresponding to different optical characteristics. Alternatively, there can be at least two different regions.

In an alternative specific embodiment, the present invention provides an alternative reticle device. The device has a quartz substrate, which has a surface region. A first region comprising a plurality of binary mask patterns is formed on a first portion of the surface region. A second region comprising a plurality of first phase shift mask patterns is formed on a second portion of the surface region. Preferably, the first phase shift mask patterns are characterized by a first transmission rate. The device has a third region comprising a plurality of second phase shift mask patterns on a third portion of the surface region. Preferably, the second phase shift mask patterns are characterized by a second transmission rate. The first transmission rate is different from the second transmission rate.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the present invention provides a multi-transmission rate optical mask for manufacture of integrated circuits. Such mask can be used for making different sized patterns (using different masking technologies) with a single light source and mask structure. Depending upon the application, one or more of these benefits may be achieved. These and other benefits will be described in more throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIG. 5 is a simplified diagram illustrating depth of field calculations according to embodiments of the present invention.

FIGS. 6 and 7 illustrate various tables for experiments performed according to embodiments of the present invention.

DETAILED DESCRIPTION OF THE INVENTION

According to the present invention, techniques directed to integrated circuits and their processing for the manufacture of semiconductor devices are provided. More particularly, the invention provides a method and structures for a multi-transmission rate optical mask structure for manufacture of semiconductor devices. Merely by way of example, the invention has been applied to the manufacture of advanced integrated circuit devices, but it would be recognized that the invention has a much broader range of applicability.

Figure 1:
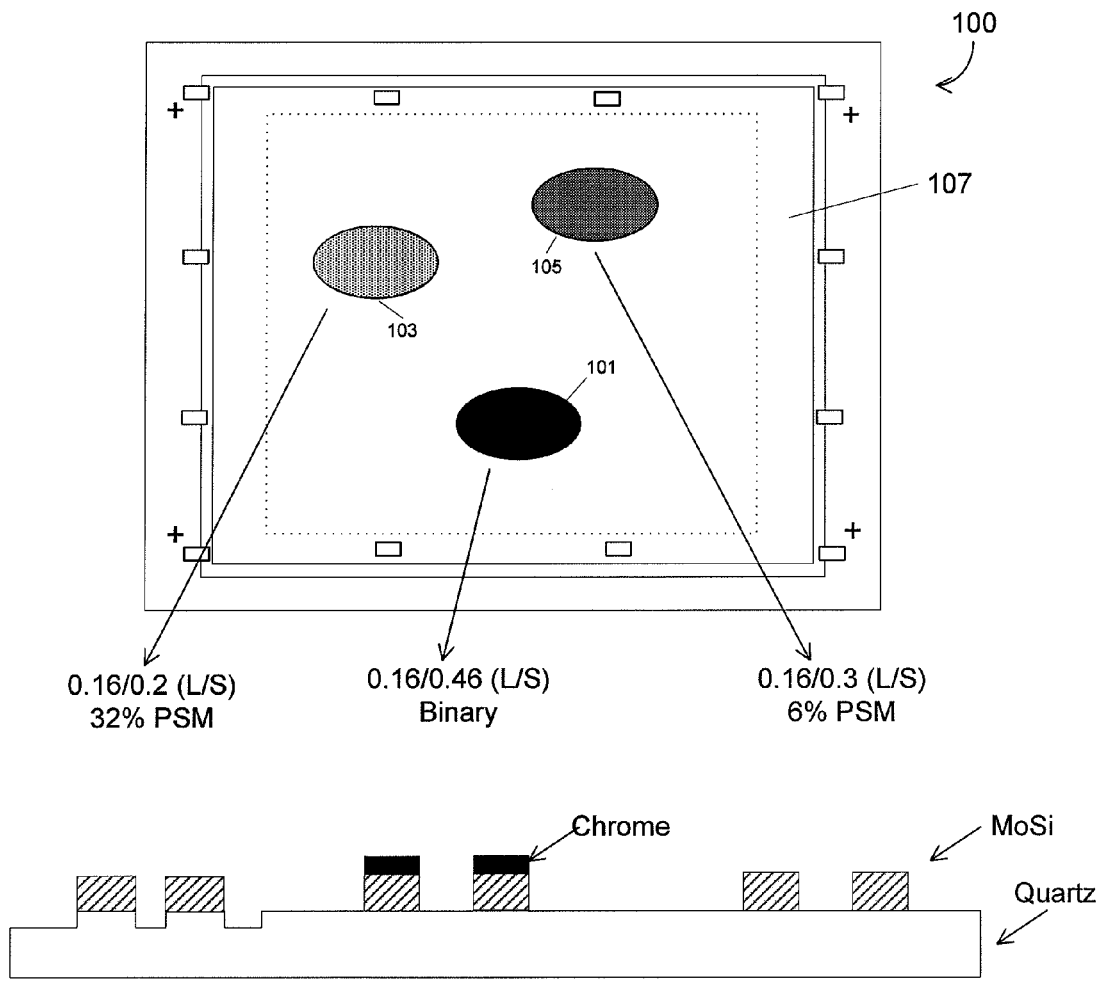
FIG. 1 is a simplified top-view diagram of a retical structure according to an embodiment of the present invention.

FIG. 1 is a simplified top-view diagram of a retical structure according to an embodiment of the present invention. This diagram is merely an example, which should not unduly limit the scope of the claims herein. One of ordinary skill in the art would recognize other variations, modifications, and alternatives. Here, the term "mask" and retical are used interchangably. As shown, the present invention provides an novel reticle device 100. The device has a quartz substrate 107, which has a surface region. A first region 101 comprising a plurality of binary mask patterns is formed on a first portion of the surface region. The binary pattern is form a line spacing of 0.46 micron and a line width of 0.16 micron, but can be others. As shown, the binary mask includes a blocking layer made of chrome or other suitable material. A second region 103 comprising a plurality of first phase shift mask patterns is formed on a second portion of the surface region. Preferably, the first phase shift mask patterns are characterized by a first transmission rate. Preferably, the first transmission rate is 32% for a line width of 0.16 micron and spacing between lines of 0.20 micron. Of course, there can also be other transmission rates and spacings. The device has a third region 105 comprising a plurality of second phase shift mask patterns on a third portion of the surface region. Preferably, the second phase shift mask patterns are characterized by a second transmission rate. Preferably, the second transmission rate is 6% for a line width of 0.16 micron and line spacing of 0.30 micron. Of course, there can also be other transmission rates and spacings. The first transmission rate is different from the second transmission rate. Details of the present reticle structure can be found throughout the present specification and more particularly below.

Figure 2:
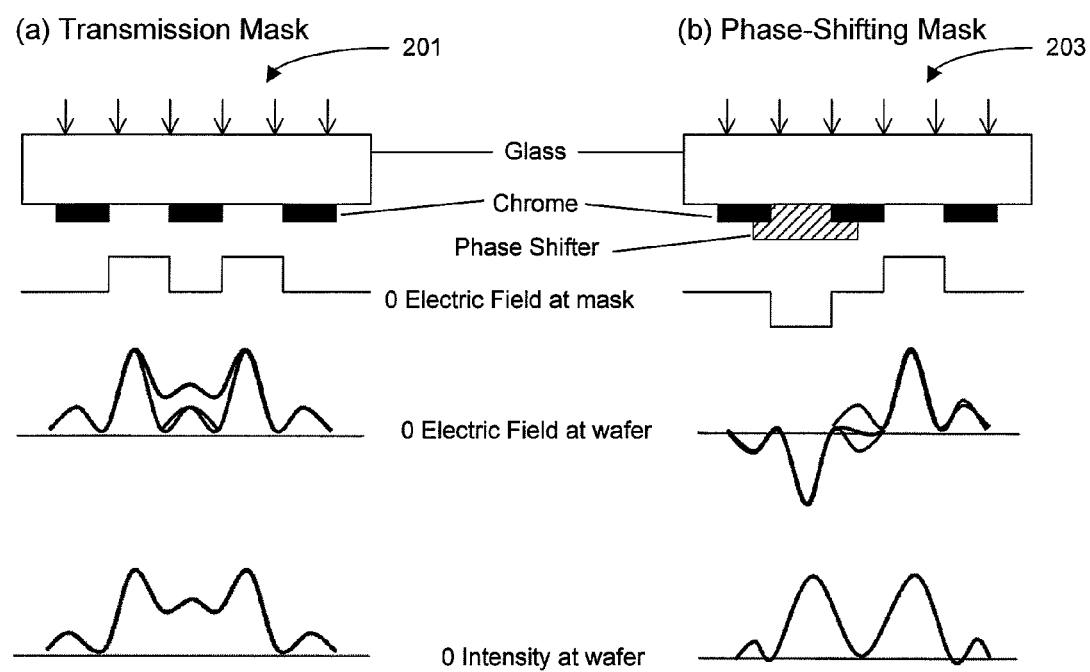
FIG. 2 is a simplified diagram illustrating a transmission mask and a phase-shift mask according to embodiments of the present invention.

FIG. 2 is a simplified diagram illustrating a transmission mask and a phase-shift mask according to embodiments of the present invention. This diagram is merely an example, which should not unduly limit the scope of the claims herein. One of ordinary skill in the art would recognize other variations, modifications, and alternatives. As shown, the diagram illustrates a transmission mask 201 and phase shift mask 203. The transmission mask and the phase shift mask are illuminated using a similar source and attempting to print the same line width and line spacing. As shown, the transmission mask is made of a glass substrate with an overlying patterned chrome layer thereon. Irradiation from the source traverses through the glass and is blocked by the portions of the chrome layer. The electric field at the mask is illustrated by step like pattern corresponding to the patterns on the mask. The electric field at the mask illustrates interference from the irradiation. The intensity at the wafer also has interference influences for the transmission mask.

The phase shift mask has similar mask elements and also has phase shifter layer. The electric field at the mask illustrates a negative electric field on the phase shifted portion of the mask and a positive electric field on the transmission portion of the mask. The electric field at the wafer are similar to the electric field on the mask. Intensity at the wafer illustrates a double peak pattern that will form improved patterning to the transmission mask. The phase shift mask is desired for the transmission rate, line spacing, and line width according to a specific embodiment. Various types of phase shift reticles can be used according to a specific embodiment.

Figure 3:
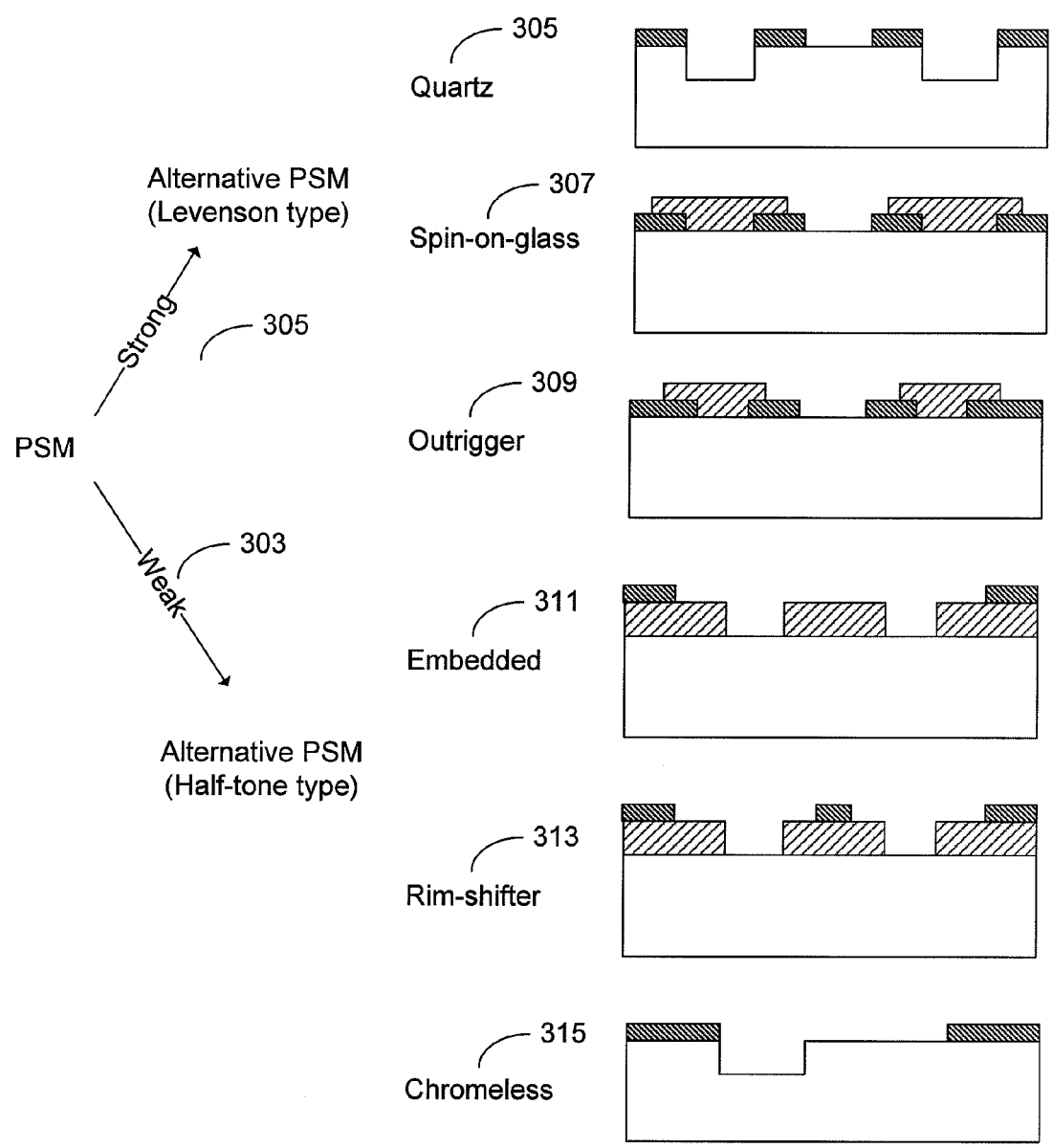
FIG. 3 is a simplified diagram illustrating various phase-shift mask reticles according to embodiments of the present invention.

FIG. 3 is a simplified diagram illustrating various phase-shift mask reticles 300 according to embodiments of the present invention. This diagram is merely an example, which should not unduly limit the scope of the claims herein. One of ordinary skill in the art would recognize other variations, modifications, and alternatives. As shown, there are strong 301 phase shifting techniques and weak 303 phase shifting techniques. The strong phase shifting techniques include mask structures such as those by Levenson. The Levenson masks include quartz 305, spin on glass 307, and outrigger 309, and the like. The weak phase shifting techniques include attenuated phase shift masks such as embedded 311, rim-shifter 313, chromeless 315, and others. Of course, there can be other variations, modifications, and alternatives.

Figure 4:
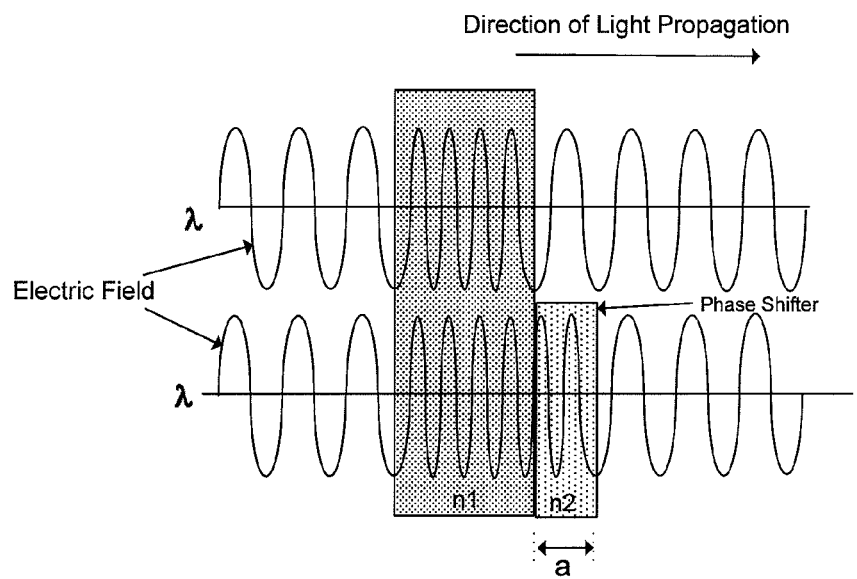
FIG. 4 is a simplified diagram illustrating a phase shift phenomena by M. D. Levenson.

FIG. 4 is a simplified diagram illustrating a phase shift phenomena by M. D. Levenson. As shown, the Levenson type mask includes a phase shifter layer having refractive index n2 and substrate layer with refractive index n1. The phase shifting layer has thickness "a." As shown, the phase shift layer is opposite in sign as the non-phase shifted layer. Relationships between the phase shift (theta) as a function of thickness, reactive index, and wavelength are illustrated. Thereafter, the thickness has been calculated. Further details of the present invention can be found throughout the present specification and more particularly according to the examples below.

It is also understood that the examples and embodiments described herein are for illustrative purposes only and that various modifications or changes in light thereof will be suggested to persons skilled in the art and are to be included within the spirit and purview of this application and scope of the appended claims.

EXAMPLES

To prove the operation and method of the present invention, we performed certain experiments to implement aspects of the invention. These experiments are merely examples, which should not unduly limit the scope of the claims herein. One of ordinary skill in the art would recognize other variations, alternatives, and modifications.

As background, the attenuated Phase Shift Mask has been widely used for current IC manufacturing companies. The most popular is 6% attenuated phase shift mask ("PSM"). Unfortunately, for a constant transmission rate PSM (like 6%) has intrinsic optical limitation when it comes to multi-pitch layout, which means overlapping DOF (Depth of Focus) for through-pitch designs will be not robust enough for manufacturing. Depth of focus is illustrated by FIG. 5, for example. We have performed certain simulations in these experiments. Such simulations have indicated that, high transmission masks provide benefits over the conventional transmission ones in terms of resolution, DOF, better pattern fidelity through focus, i.e., reduced corner rounding and line end shortening. A goal of this work we supposed to compare the performance of 32% attenuated PSM with 6% attenuated PSM and binary Mask. Finally to find a way to apply different transmission rate for certain pitches to achieve overall improvement in through pitch gate level features with current lithography exposure tools.

We simulated mask sets for 0.16 micron technology line widths. Depending upon the application, different line spacings were used. The 0.16 um features with no OPC correction were simulated with Line Width/Space Width: 0.16/0.2; 0.16/0.24; 0.16/0.3; 0.16/0.46; 0.16/0.8; 0.16/1.6 using 0.45 um UV6 (Shipley) PR on 0.06 um optimized BARC with Wavelength=248 nm and 0.6 NA and 0.8 delta for a conventional illumination condition. By simulation of a binary mask show poor depth of focus (less than 0.6 um at 6% EL) for dense and Iso. For semi-dense pitch its performance was reasonable but less than 0.75 um DOF. Individual DOF improved by 10~40% for 6% att. Mask than binary mask. Duty cycles from 1.5~Isolated, 0.45 overlapping DOF (ODOF) is obtained at 6% EL. OPC is required for overlap the dense (pitch<0.4 um) with pitch>0.4 um.

The 32% att. Mask dense and semi-dense feature showed a DOF of about 0.7~1.0 um. The higher transmissions inherently produce a better resolution or higher aerial image contrast. The process window and its output for Binary, 6% att. and 32% att. Mask for pitch are in Table 1 of FIG. 6. Based on the datain Table 1, we apply multi-transmission attenuated Mask. The strategy has been shown in Table 2 also of FIG. 6. As shown, the 32% attenuated mask was used for certain duty ratio 0.16/0.2, 0.16/0.24 and full isolated feature 0.16/1.6. For duty ratio 0.16/0.3 and 0.16/0.8 6% att. mask were used. Only for 0.16/0.46 duty ratio binary mask show a better DOF over than 6% or 32% attenuted Mask. By that overall improvement through pitch feature in resolution and higher aerial image contrast can be obtained. It was observed the "No ODOF" between pitched with this kind of multi-transmission approach. OPC will be needed for overlap of dense features with pitches larger than 240 nm. This kind idea of multi-transmission att. Mask approach also can be used for hole-like layers such as contact (CT) and via layer. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A reticle device comprising:
   a quartz substrate, the quartz substrate comprising a surface region;
   a first region comprising a plurality of binary mask patterns on a first portion of the surface region, the binary mask patterns including at least a first region of a blocking layer immediate adjacent to a second region of exposed quartz substrate, the plurality of binary mask pattern being used for at least a first line width and a first spacing;
   a second region comprising a plurality of first phase shift mask patterns on a second portion of the surface region, the plurality of the first phase shift mask pattern comprising a first plurality of MoSi patterns, the first phase shift mask patterns being characterized by a first transmission rate, and the first transmission rate being used for at least a second line width and a second spacing; and
   a third region comprising a plurality of second phase shift mask patterns on a third portion of the surface region, the plurality of the second phase shift mask pattern comprising a second plurality of MoSi patterns, the second phase shift mask patterns being characterized by a second transmission rate, the second transmission rate being used for at least a third line width and a third spacing;
   wherein:
   the first transmission rate is higher than the second transmission rate; and
   the second spacing is less than the third spacing.

2. The device of claim 1 wherein the binary mask patterns comprise a plurality of chrome mask patterns, each of the chrome mask patterns being capable of blocking electromagnetic energy.

3. The device of claim 1 wherein the first transmission rate is about 32%.

4. The device of claim 1 wherein the second transmission rate is about 6 percent.

5. The device of claim 1 wherein the quartz substrate is a single substrate.

6. The device of claim 1 wherein the first line width and the first spacing are different than the second line width and the second spacing, and the first line width and the first spacing are different than the third line width and the third spacing.

7. A reticle device comprising:
   a quartz substrate, the quartz substrate comprising a surface region;
   a first region comprising a plurality of binary mask patterns on a first portion of the surface region, the plurality of binary mask pattern being used for at least a first line width and a first spacing;
   a second region comprising a plurality of first phase shift mask patterns on a second portion of the surface region, the second region being provided by a first plurality of MoSi regions, the first phase shift mask patterns being characterized by a first transmission rate, and the first transmission rate being used for at least a second line width and a second spacing; and
   a third region comprising a plurality of second phase shift mask patterns on a third portion of the surface region, the third region being provided by a second plurality of MoSi regions, the second phase shift mask patterns being characterized by a second transmission rate, the second transmission rate being used for at least a third line width and a third spacing;
   wherein:
   the first transmission rate is higher than the second transmission rate; and
   the second spacing is less than the third spacing.

8. The device of claim 7 wherein the binary mask patterns comprise a plurality of chrome mask patterns, each of the chrome mask patterns being capable of blocking electromagnetic energy.

9. The device of claim 7 wherein the first transmission rate is about 32%.

10. The device of claim 7 wherein the second transmission rate is about 6 percent.

11. The device of claim 7 wherein the quartz substrate is a single substrate.

12. The device of claim 7 wherein the first line width and the first spacing are different than the second line width and the second spacing, and the first line width and the first spacing are different than the third line width and the third spacing.

13. A reticle device comprising:
   a quartz substrate, the quartz substrate including a surface region;
   a first region comprising a plurality of binary mask patterns on a first portion of the surface region, the binary mask patterns including at least a first region of a blocking layer immediate adjacent to a region of exposed quartz substrate, the plurality of binary mask pattern being used for at least a first line width and a first spacing;

a second region comprising a plurality of first phase shift mask patterns on a second portion of the surface region, the second region being provided by a first plurality of MoSi regions, the first phase shift mask patterns being characterized by a first transmission rate, and the first transmission rate being used for at least a second line width and a second spacing; and a third region comprising a plurality of second phase shift mask patterns on a third portion of the surface region, the third region being provided by a second plurality of MoSi regions, the second phase shift mask patterns being characterized by a second transmission rate, the second transmission rate being used for at least a third line width and a third spacing, wherein the second line width and the second spacing are different than the third line width and the third spacing.

14. The device of claim 13 wherein the first transmission rate is different from the second transmission rate.

15. The device of claim 13 wherein the first transmission rate is about 32%.

16. The device of claim 13 wherein the second transmission rate is about 6%.

17. The device of claim 13 wherein the quartz substrate is a single substrate.

18. The device of claim 13 wherein the first line width and the first spacing are different than the second line width and the second spacing, and the first line width and the first spacing are different than the third line width and the third spacing.

* * * * *